United States Patent
Kim et al.

(10) Patent No.: US 7,816,649 B2
(45) Date of Patent: Oct. 19, 2010

(54) LASER PATTERNING APPARATUS

(75) Inventors: Do-Young Kim, Suwon-si (KR);
Tae-Min Kang, Suwon-si (KR);
Sang-Bong Lee, Suwon-si (KR);
Seung-Mook Lee, Suwon-si (KR);
Hee-Cheol Kang, Suwon-si (KR);
Jin-Won Sun, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 268 days.

(21) Appl. No.: 12/184,128

(22) Filed: Jul. 31, 2008

(65) Prior Publication Data

US 2009/0166561 A1 Jul. 2, 2009

(30) Foreign Application Priority Data

Dec. 28, 2007 (KR) .................. 10-2007-0140959

(51) Int. Cl.
*A61N 5/00* (2006.01)
*G21G 5/00* (2006.01)

(52) U.S. Cl. .............. 250/318; 250/316.1; 250/317.1; 250/319; 430/41; 430/199; 430/200; 430/270.1; 430/271.1; 430/322; 430/945; 347/171; 347/224; 347/225; 347/227; 347/238; 347/241; 438/29; 438/99

(58) Field of Classification Search .............. 250/492.1, 250/492.22; 430/41, 199, 200, 270.1, 271.1, 430/322, 945; 347/171, 224, 225, 227, 238, 347/241; 438/29, 99
See application file for complete search history.

(56) References Cited

U.S. PATENT DOCUMENTS 7,335,394 B2 * 2/2008 Kang .................... 427/148
7,666,570 B2 * 2/2010 Noh et al. .............. 430/270.1

FOREIGN PATENT DOCUMENTS

KR 10-0645534 B1 11/2006
KR 10-2007-0102299 A 10/2007

* cited by examiner

*Primary Examiner*—Jack I Berman
*Assistant Examiner*—Meenakshi S Sahu
(74) *Attorney, Agent, or Firm*—Christie, Parker & Hale, LLP

(57) ABSTRACT

A laser patterning apparatus for handling a donor film and improving compression uniformity between the donor film and an acceptor substrate is provided. The laser patterning apparatus includes: a stage that supports an acceptor substrate; a shielding mask that is placed on the acceptor substrate to form a pattern and is attached to a donor film on one surface thereof; a laser gun that is disposed at an upper part of the stage to radiate laser light to a portion of the donor film through the pattern of the shielding mask; a pressing member that corresponds to a portion of the shielding mask; and an actuator that is connected to one side of the pressing member to press the pressing member.

14 Claims, 3 Drawing Sheets

LASER PATTERNING APPARATUS

CROSS-REFERENCE TO RELATED APPLICATION

This application claims priority to and the benefit of Korean Patent Application No. 10-2007-0140959, filed in the Korean Intellectual Property Office on Dec. 28, 2007, the entire contents of which are incorporated herein by reference.

BACKGROUND OF THE INVENTION

1. Field of the Invention

The present invention relates to a laser patterning apparatus. More particularly, the present invention relates to a laser patterning apparatus for handling a donor film and improving compression uniformity and transfer characteristics between the donor film and an acceptor substrate.

2. Description of the Related Art

A laser induced thermal imaging (LITI) method is a transfer method using laser light, and includes a donor substrate and an acceptor substrate.

Laser light is absorbed into a light to heat conversion (LTHC) layer of the donor substrate to be converted to heat energy, and a transfer layer of the donor substrate is transferred to the acceptor substrate by the heat energy. Because the transfer layer is transferred to the acceptor substrate, a desired image is formed in the acceptor substrate.

In more detail, the LITI method is performed as follows. After the acceptor substrate is positioned on a stage, the donor substrate (or donor film) is laminated on the acceptor substrate. One surface of the donor film is covered with a transfer layer that is made of a material for transferring.

When laminating, bubbles between the donor film and the acceptor substrate are removed using a roller. The laminated donor film is adsorbed and fixed by a vacuum groove of a chuck.

By providing a shielding mask on the donor film and radiating laser light to the shielding mask, in a portion in the donor film that receives the laser light, light is converted to heat energy to transfer the transfer layer on the donor film to the acceptor substrate, and in a portion that does not receive laser light, the transfer layer is maintained on the donor film.

After a transfer operation is completed, by removing the laminated donor film and shielding mask, the transfer layer that is transferred on the acceptor substrate forms an image of the same (or substantially the same) pattern as that of the shielding mask.

The donor film should be aligned and compressed on the acceptor substrate, but because the donor film has flexibility, the donor film should not be handled when being maintained in a flat plate shape.

Further, bubbles remaining between the donor film and the acceptor substrate are removed by being temporarily compressed to the acceptor substrate with the roller. Therefore, during a transfer process of radiating laser light, the donor film does not continuously receive a compression force acting on the acceptor substrate. As such, compression uniformity between the donor film and the acceptor substrate is lowered and transfer characteristics therebetween are deteriorated.

The above information disclosed in this Background section is only for enhancement of understanding of the background of the invention and therefore it may contain information that does not form the prior art that is already known in this country to a person of ordinary skill in the art.

SUMMARY OF THE INVENTION

An aspect of an embodiment of the present invention is directed toward a laser patterning apparatus for handling a donor film, and improving compression uniformity and transfer characteristics between the donor film and an acceptor substrate.

An exemplary embodiment of the present invention provides a laser patterning apparatus including: a stage that supports an acceptor substrate; a shielding mask that is placed on the acceptor substrate to form a pattern and attached to a donor film on one surface thereof; a laser gun that is disposed at an upper part of the stage to radiate laser light to a portion of the donor film through the pattern of the shielding mask; a pressing member that corresponds to a portion of the shielding mask; and an actuator that is connected to one side of the pressing member to press the pressing member.

The shielding mask may be formed with a glass substrate.

The shielding mask may include a transfer area corresponding to the donor film and a non-transfer area corresponding to an outer side of the donor film at an outer side of the transfer area, wherein the pressing member may be formed with a rim corresponding to at least a part of the non-transfer area.

In one embodiment, with respect to a plane of the stage, an interval is formed between the end of an inner side of the pressing member and the end of an outer side of the transfer area.

In one embodiment, with respect to a plane of the stage, the actuator corresponds to the center between the end of an outer side of the transfer area and the end of an outer side of the shielding mask.

The actuator may be formed with a plurality of cylinders and be symmetrically disposed with respect to the center of the donor film.

The pressing member may be formed with a quadrangular rim, and the actuator may be formed with four cylinders that are respectively disposed at four corners (or corner portions) of the quadrangular rim.

DETAILED DESCRIPTION OF THE EMBODIMENTS

Figure 1:
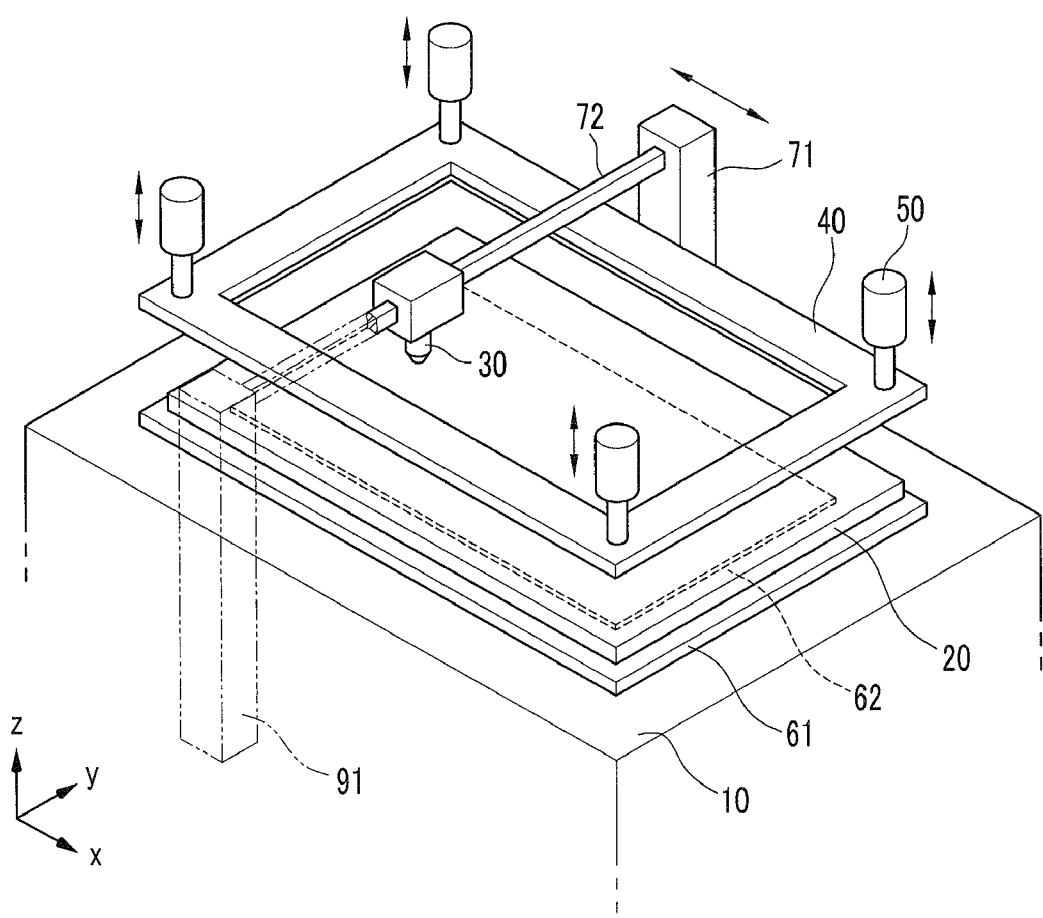
FIG. 1 is a perspective schematic view of a laser patterning apparatus according to an exemplary embodiment of the present invention.

The present invention will be described more fully hereinafter with reference to the accompanying drawings, in which certain exemplary embodiments of the invention are shown. As those skilled in the art would realize, the described embodiments may be modified in various different ways, all without departing from the spirit or scope of the present invention. The drawings and description are to be regarded as illustrative in nature and not restrictive. Also, in the context of the present application, when an element is referred to as being "on" another element, it can be directly on the another element or be indirectly on the another element with one or more intervening elements interposed therebetween. Like reference numerals designate like elements throughout the specification.

Figure 2:
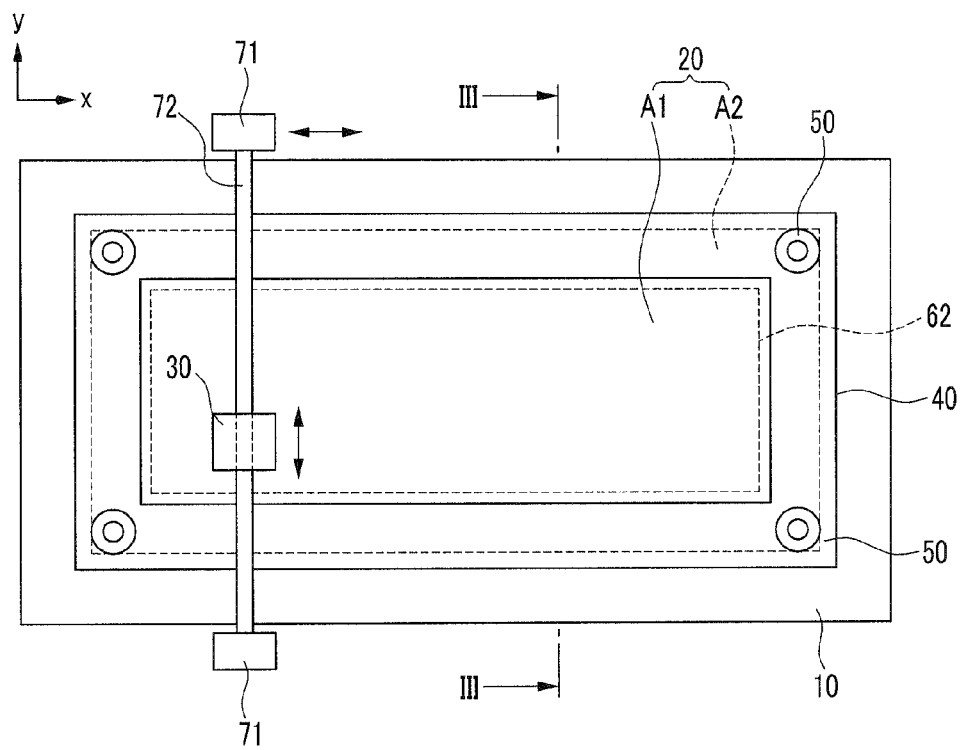
FIG. 2 is a top plan schematic view of the laser patterning apparatus of FIG. 1.

FIG. 1 is a perspective schematic view of a laser patterning apparatus according to an exemplary embodiment of the present invention, and FIG. 2 is a top plan view of the laser patterning apparatus of FIG. 1.

Referring to FIGS. 1 and 2, the laser patterning apparatus includes a stage 10, a shielding mask 20, a laser gun 30, a pressing member 40, and an actuator 50.

The stage 10 is formed in a flat shape and provides a place for performing a laser induced thermal imaging process. The stage 10 primarily supports an acceptor substrate 61, and it also supports a donor film 62 and the shielding mask 20 (that are placed on the acceptor substrate 61) through the acceptor substrate 61.

The acceptor substrate 61 may be made of thin film transistor (TFT) glass to form one substrate of a display device.

Figure 4:
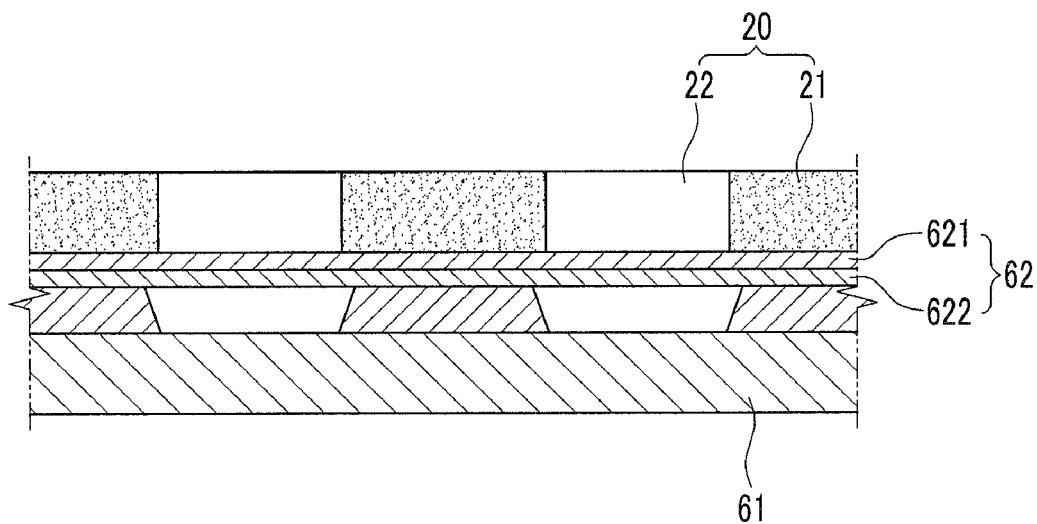
FIG. 4 is a cross-sectional schematic view illustrating a state before a transfer layer of a donor film is transferred.

The donor film 62 has flexibility and includes an LTHC layer 621 and a transfer layer 622 (see FIG. 4). The LTHC layer 621 generates heat energy though the radiation of laser light to transfer the transfer layer 622 that is made of a light emitting material to the acceptor substrate 61.

The shielding mask 20 forms a pattern for transferring to the acceptor substrate 61 and selectively passes laser light to the donor film 62 through the pattern. The shielding mask 20 includes a shielding portion 21 for shielding laser light and a passing portion 22 for passing the laser light in order to form the pattern (see FIG. 4).

The shielding mask 20 attaches the donor film 62 to one surface thereof and may be made of glass, for example, for passing laser light through to the passing portion 22.

The donor film 62 has flexibility, and when the donor film 62 is placed on the acceptor substrate 61 to be absorbed by the acceptor substrate 61, the donor film 62, in terms of handling, should maintain a flat state corresponding to the acceptor substrate 61.

As the donor film 62 is attached to the shielding mask 20, the donor film 62 can be integrally handled with the shielding mask 20. That is, as the donor film 62 maintains a flat state as in (or with) the shielding mask 20, the donor film 62 can be easily handled even though it has flexibility.

The donor film 62 is attached to the shielding mask 20 through the LTHC layer 621 for forming one surface thereof, and the transfer layer 622 is provided in the other surface thereof positioned toward the acceptor substrate 61.

Figure 3:
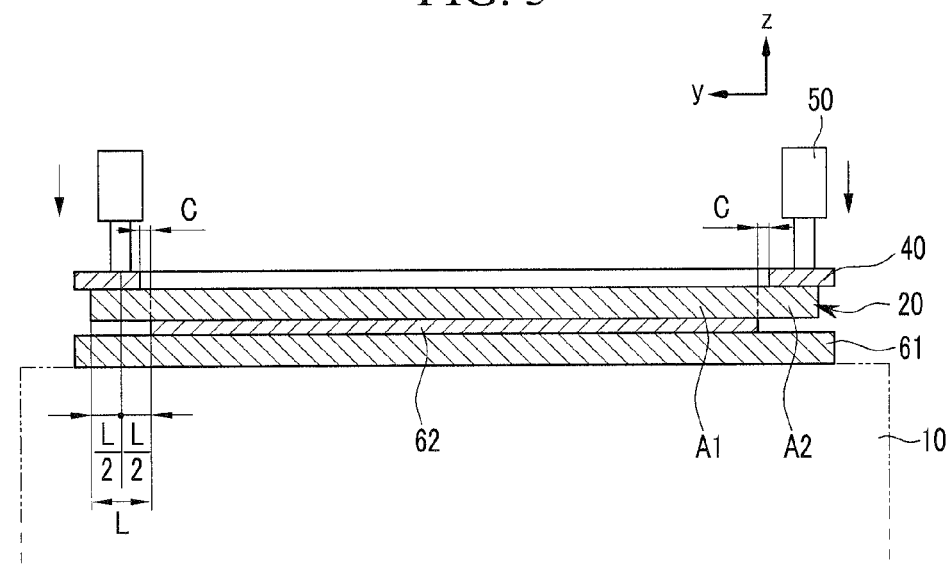
FIG. 3 is a schematic view illustrating an operation of compressing a shielding mask and a donor film to an acceptor substrate.

The shielding mask 20 includes a transfer area A1 corresponding to (or overlapping) the donor film 62, and a non-transfer area A2 corresponding to (or overlapping) the outer side of the donor film 62 at the outer side of the transfer area A1 (see FIG. 3).

The laser gun 30 is disposed at the upper part of the stage 10 to radiate laser light to the shielding mask 20. Further, the laser gun 30 is movably provided on an x-y plane of the stage 10 to radiate laser light to at least a partial area or an entire area of the transfer area A1 of the shielding mask 20.

Referring again to FIGS. 1 and 2, the laser patterning apparatus according to the present exemplary embodiment includes an x-axis moving member 71 that is disposed in a pair at both sides in a y-axis direction of the stage 10 to move the laser gun 30 in an x-axis direction, and a y-axis moving member 72 that is provided in the y-axis direction with the x-axis moving member 71.

The laser gun 30 is mounted to the y-axis moving member 72 to move in the x-axis direction by an operation of the x-axis moving member 71, and moves in the y-axis direction on the y-axis moving member 72. Therefore, the laser gun 30 can radiate laser light to the entire area of the stage 10.

FIG. 3 is a schematic view illustrating an operation of compressing a shielding mask and a donor film to an acceptor substrate.

Referring to FIG. 3, the pressing member 40 is formed to partially correspond to the shielding mask 20 in order to press the shielding mask 20 without interrupting laser light radiation of the laser gun 30.

Because the pressing member 40 should not interrupt the laser gun 30 from radiating laser light while compressing the donor film 62 to the acceptor substrate 61 through the shielding mask 20, the pressing member 40 is formed with a rim to correspond to at least a part of the non-transfer area A2 of the shielding mask 20.

When reflected on a plane of the stage 10, an interval C is formed between the end of an inner side of the pressing member 40 and the end of the outer side of the transfer area A1. Due to the interval C, the pressing member 40 does not interrupt the laser gun 30 from radiating laser light to the transfer area A1.

The pressing member 40 is provided to ascend to and descend from the shielding mask 20, and may press the shielding mask 20 with its own weight when it is formed with a heavy body.

The laser patterning apparatus according to the present exemplary embodiment may further include an actuator 50 for pressing by ascending to and descending from the pressing member 40. The actuator 50 is connected to one side of the pressing member 40 at the outside of a laser light radiation range of the laser gun 30 on an x-y plane.

The actuator 50 may be suitably formed, and in the present exemplary embodiment, the actuator 50 is formed as a cylinder. According to an operation of the actuator 50, the pressing member 40 presses the shielding mask 20 and the donor film 62 in a state in which it is placed on the acceptor substrate 61 while ascending to and descending from the shielding mask 20.

An extension operation of the actuator 50 compresses the donor film 62 to the acceptor substrate 61 through the pressing member 40 and the shielding mask 20. While the actuator 50 maintains an extension operating state, a compressing state of the donor film 62 and the acceptor substrate 61 is tightly (or substantially) maintained.

Therefore, during a transfer process, compression uniformity between the donor film 62 and the acceptor substrate 61 is maintained, thereby improving transfer characteristics.

When reflected on a plane of the stage 10, the actuators 50 that are formed with a plurality of cylinders are symmetrically disposed about (or with respect to) the center of the donor film 62 (see FIG. 2).

For example, when the pressing member 40 is formed with a quadrangular rim, the actuator 50 that is formed with four cylinders is disposed at each of four corners (or corner portions) of the quadrangular rim.

Therefore, a pressing force of the actuators 50 forms a uniform distribution load on the pressing member 40. The uniform distribution load of the pressing member 40 forms a uniform distribution load over the entire donor film 62 through the shielding mask 20. Because the shielding mask 20 is made of glass, the shielding mask 20 does not have substantial flexibility, as compared with the donor film 62.

Further, the actuator 50 is disposed to correspond to (or on) the center L/2 of a distance L between the end of the outer side of the transfer area A1 and the end of the outer side of the shielding mask 20. Because the actuator 50 is disposed at the center of the non-transfer area A2, a concentrated load can be prevented from acting on the end part of the shielding mask 20.

Figure 5:
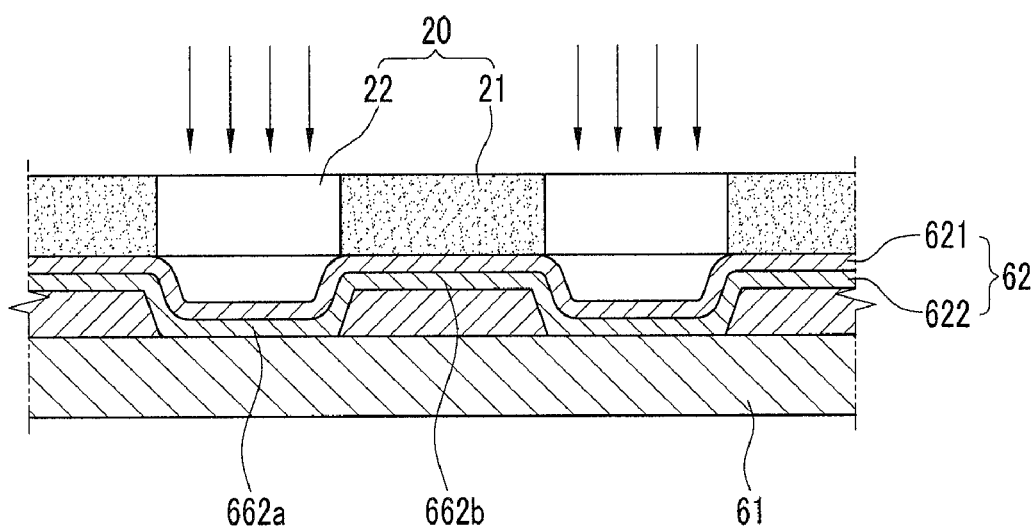
FIG. 5 is a cross-sectional schematic view illustrating a state after a transfer layer of a donor film is transferred.

FIG. 4 is a cross-sectional schematic view illustrating a state before a transfer layer of a donor film is transferred, and FIG. 5 is a cross-sectional schematic view illustrating a state after a transfer layer of a donor film is transferred.

Referring to FIGS. 4 and 5, in a state where the donor film 62 is attached to the shielding mask 20, the shielding mask 20 is placed on the acceptor substrate 61, and laser light is radiated to the shielding mask 20.

Laser light is radiated to the LTHC layer 621 of the donor film 62 through the passing portion 22 of the shielding mask 20 to be converted to heat energy. The transfer layer 622 of the donor film 62 is transferred to the acceptor substrate 61 by the heat energy.

After being transferred, when the shielding mask 20 is removed, a remaining portion 622b, excluding a portion 622a that is partially transferred from the transfer layer 622 of the donor film 62, is removed together with the LTHC layer 621 and the shielding mask 20.

Therefore, the acceptor substrate 61 forms one substrate of a display device including the transferred portion 622a.

As such, in view of the foregoing, during a series of transfer processes, the actuator 50 uniformly presses the pressing member 40 while maintaining an extended state. Therefore, compression uniformity between the donor film 62 and the acceptor substrate 61 is maintained and transfer characteristics are improved.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A laser patterning apparatus comprising:
    a stage for supporting an acceptor substrate;
    a shielding mask on the acceptor substrate and for forming a pattern and attaching to a donor film on one surface thereof;
    a laser gun at an upper part of the stage for radiating laser light to a portion of the donor film through the pattern of the shielding mask;
    a pressing member corresponding to a portion of the shielding mask; and
    an actuator connected to one side of the pressing member and configured to press the pressing member toward the acceptor substrate.

2. The laser patterning apparatus of claim 1, wherein the shielding mask comprises a glass substrate.

3. The laser patterning apparatus of claim 1, wherein the shielding mask comprises:
    a transfer area corresponding to the donor film; and
    a non-transfer area corresponding to an outer side of the donor film at an outer side of the transfer area,
    wherein the pressing member comprises a rim corresponding to at least a part of the non-transfer area.

4. The laser patterning apparatus of claim 3, wherein, with respect to a plane of the stage, an interval is formed between the end of an inner side of the pressing member and the end of an outer side of the transfer area.

5. The laser patterning apparatus of claim 3, wherein, with respect to a plane of the stage, the actuator corresponds to the center between the end of an outer side of the transfer area and the end of an outer side of the shielding mask.

6. The laser patterning apparatus of claim 3, wherein the actuator comprises a plurality of cylinders and is symmetrically disposed with respect to the center of the donor film.

7. The laser patterning apparatus of claim 3, wherein the pressing member comprises a quadrangular rim, and
    the actuator comprises four cylinders at four corner portions of the quadrangular rim.

8. A laser patterning apparatus comprising:
    a stage for supporting an acceptor substrate;
    a shielding mask for forming a pattern on the acceptor substrate and attaching to a donor film on one surface thereof;
    a laser gun at an upper part of the stage for radiating laser light to a portion of the donor film through the pattern of the shielding mask;
    a pressing member for pressing a portion of the shielding mask without interrupting laser radiation of the laser gun; and
    an actuator connected to one side of the pressing member and configured to press the pressing member toward the acceptor substrate.

9. The laser patterning apparatus of claim 8, wherein the shielding mask comprises a glass substrate.

10. The laser patterning apparatus of claim 8, wherein the shielding mask comprises:
    a transfer area overlapping the donor film; and
    a non-transfer area overlapping an outer side of the donor film at an outer side of the transfer area,
    wherein the pressing member comprises a rim overlapping at least a part of the non-transfer area.

11. The laser patterning apparatus of claim 10, wherein, with respect to a plane of the stage, an interval is formed between the end of an inner side of the pressing member and the end of an outer side of the transfer area.

12. The laser patterning apparatus of claim 10, wherein, with respect to a plane of the stage, the actuator is on the center between the end of an outer side of the transfer area and the end of an outer side of the shielding mask.

13. The laser patterning apparatus of claim 10, wherein the actuator comprises a plurality of cylinders and is symmetrically disposed with respect to the center of the donor film.

14. The laser patterning apparatus of claim 10, wherein the pressing member comprises a quadrangular rim, and
    the actuator comprises four cylinders at four corner portions of the quadrangular rim.

* * * * *